US012575080B2

(12) United States Patent
Tang

(10) Patent No.: US 12,575,080 B2
(45) Date of Patent: Mar. 10, 2026

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 766 days.

(21) Appl. No.: 17/821,834

(22) Filed: Aug. 24, 2022

(65) Prior Publication Data
US 2023/0397400 A1      Dec. 7, 2023

(30) Foreign Application Priority Data
Jun. 6, 2022    (CN) .......................... 202210629945.4

(51) Int. Cl.
*H10B 12/00*        (2023.01)
*H10D 30/67*        (2025.01)

(52) U.S. Cl.
CPC ............. *H10B 12/30* (2023.02); *H10B 12/05* (2023.02); *H10B 12/488* (2023.02); *H10D 30/6735* (2025.01); *H10D 30/6757* (2025.01)

(58) Field of Classification Search
CPC ...... H10B 12/30; H10B 12/05; H10B 12/488; H10B 12/482; H10B 12/315; H10B 12/033; H10B 12/056; H10B 12/36; H10B 12/02; H10D 30/6735; H10D 30/6757; H10D 30/014; H10D 30/43; H10D 62/121; H10D 30/0243; H10D 64/017; B82Y 10/00
See application file for complete search history.

(56) References Cited

U.S. PATENT DOCUMENTS

| | | | |
|---|---|---|---|
| 2021/0125989 A1* | 4/2021 | Shin ........................ | H10B 12/02 |
| 2021/0242210 A1 | 8/2021 | Lee | |
| 2022/0122975 A1* | 4/2022 | Ryu ........................ | H10B 12/30 |

FOREIGN PATENT DOCUMENTS

CN          113206092 A      8/2021

* cited by examiner

*Primary Examiner* — Jonathan Han
(74) *Attorney, Agent, or Firm* — Syncoda LLC; Feng Ma

(57)          ABSTRACT
Embodiments of the present disclosure relate to the field of semiconductors, and provide a semiconductor structure and a manufacturing method thereof. The semiconductor structure includes: a base and a bit line that extends along a first direction; active structures, wherein the active structure includes at least two active layers arranged at intervals, the active layer includes a first source-drain region, a channel region, a second source-drain region, and a support region, and the bit line is connected to the first source-drain region; a word line extending along a second direction, wherein the word line is connected to an adjacent active structure, and the word line surrounds at least two channel regions included in the connected active structure; and a memory structure perpendicularly stacked on the base, where the memory structure is connected to the second source-drain region, and the memory structure surrounds the support region.

18 Claims, 12 Drawing Sheets

141 ⎫
142 ⎬ 140
151 ⎫
152 ⎬ 143

114

100

104

103

105

102

100

107

104

103

105

102

100

Z

Y

107

104

103

105

102

100

Z

Y

103

105

100

Z

Y

108

105

103

100

Z

Y

SEMICONDUCTOR STRUCTURE AND MANUFACTURING METHOD THEREOF

CROSS-REFERENCE TO RELATED APPLICATIONS

This application claims the priority of Chinese Patent Application No. 202210629945.4, submitted to the Chinese Intellectual Property Office on Jun. 6, 2022, the disclosure of which is incorporated herein in its entirety by reference.

TECHNICAL FIELD

Embodiments of the present disclosure relate to the field of semiconductors, and in particular, to a semiconductor structure and a manufacturing method thereof.

BACKGROUND

With the continuous development of integrated circuit manufacturing technologies, in order to improve an integration degree of an integrated circuit, improve an operating speed of a memory, and reduce a power consumption of the memory, a metal-oxide-semiconductor field-effect transistor (MOSFET) device continuously reduces its feature size, and faces a series of challenges. For example, in order to reduce a device linewidth, a semiconductor structure has begun to develop from an embedded word line structure to a gate-all-around (GAA) structure. However, an integration degree of a memory device is mainly determined by an area occupied by a unit memory cell, in other words, a storage capacity of the memory device is also limited by a size of the memory device.

How to reduce the device linewidth and further increase storage density has become an important problem to be resolved by those skilled in the art.

SUMMARY

Embodiments of the present disclosure provide a semiconductor structure and a manufacturing method thereof.

According to some embodiments of the present disclosure, according to an aspect, an embodiment of the present disclosure provides a semiconductor structure, including: a base, wherein a bit line that extends along a first direction is provided on a surface of the base; active structures arranged at intervals along a direction perpendicular to the surface of the base, wherein the active structure includes at least two active layers arranged at intervals, the active layer includes a first source-drain region, a channel region, a second source-drain region, and a support region, and the bit line is connected to the first source-drain region; a word line extending along a second direction, wherein the word line is connected to an adjacent active structure, and the word line surrounds at least two channel regions included in the connected active structure; and a memory structure perpendicularly stacked on the base, wherein the memory structure is connected to the second source-drain region, and the memory structure surrounds the support region.

According to some embodiments of the present disclosure, according to another aspect, an embodiment of the present disclosure provides a method of manufacturing a semiconductor structure, including: providing a base; forming active structures and a bit line that extends along a first direction, wherein the bit line is located on a surface of the base, the active structures are arranged at intervals along a direction perpendicular to the surface of the base, the active structure includes at least two active layers arranged at intervals, the active layer includes a first source-drain region, a channel region, a second source-drain region, and a support region, and the bit line is connected to the first source-drain region; forming a word line extending along a second direction, wherein the word line is connected to an adjacent active structure, and the word line surrounds at least two channel regions included in the connected active structure; and forming a memory structure perpendicularly stacked on the base, wherein the memory structure is connected to the second source-drain region, and the memory structure surrounds the support region.

DETAILED DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified. To describe the technical solutions in the embodiments of the present disclosure or in the prior art more clearly, the following outlines the accompanying drawings to be used in the embodiments of the present disclosure. Apparently, the accompanying drawings outlined below are merely some embodiments of the present disclosure. Those of ordinary skill in the art may derive other drawings from the outlined accompanying drawings without making any creative effort.

DETAILED DESCRIPTION

The embodiments of the present disclosure provide a semiconductor structure and a manufacturing method thereof. A stacked active layer is used as an active structure, and a word line surrounds a channel region of the active layer (GAA structure). The active structure with a plurality of channel regions is used together with the GAA structure, thereby realizing high mobility and low conductive resistance. This can ensure that the semiconductor structure has a large driving current. In addition, a single active layer of the active structure with the plurality of channel regions may be thin, such that electrons in a channel region of the active layer can be completely depleted. This can suppress charge accumulation caused by a body effect, increase current density, and realize better power characteristics. The thin active layer can reduce a linewidth of the semiconductor structure in a direction perpendicular to a base. A support region of the active layer is used as a support layer of a memory structure, and the memory structure is converted from a perpendicular capacitor structure to a horizontal capacitor structure. That is, transistors and capacitors can be stacked on a surface of the base in a three-dimensional manner to increase an area of the memory structure, which is conducive to increasing storage density of the semiconductor structure.

The embodiments of the present disclosure are described in detail below with reference to the accompanying drawings. Those skilled in the art should understand that many technical details are proposed in the embodiments of the present disclosure to make the present disclosure better understood. However, even without these technical details and various changes and modifications made based on the following embodiments, the technical solutions claimed in the present disclosure may still be realized.

Figure 1:
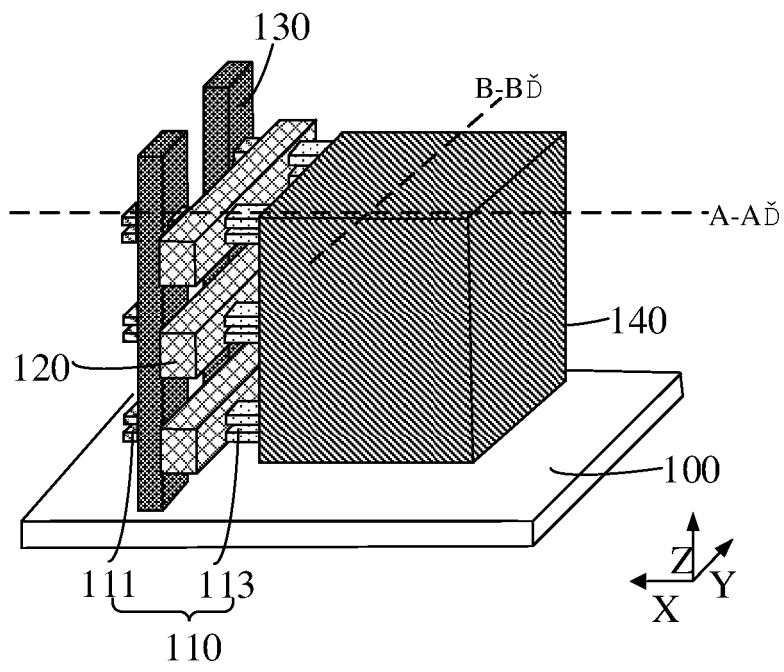
FIG. 1 is a schematic structural diagram of a semiconductor structure according to an embodiment of the present disclosure.
Figure 2:
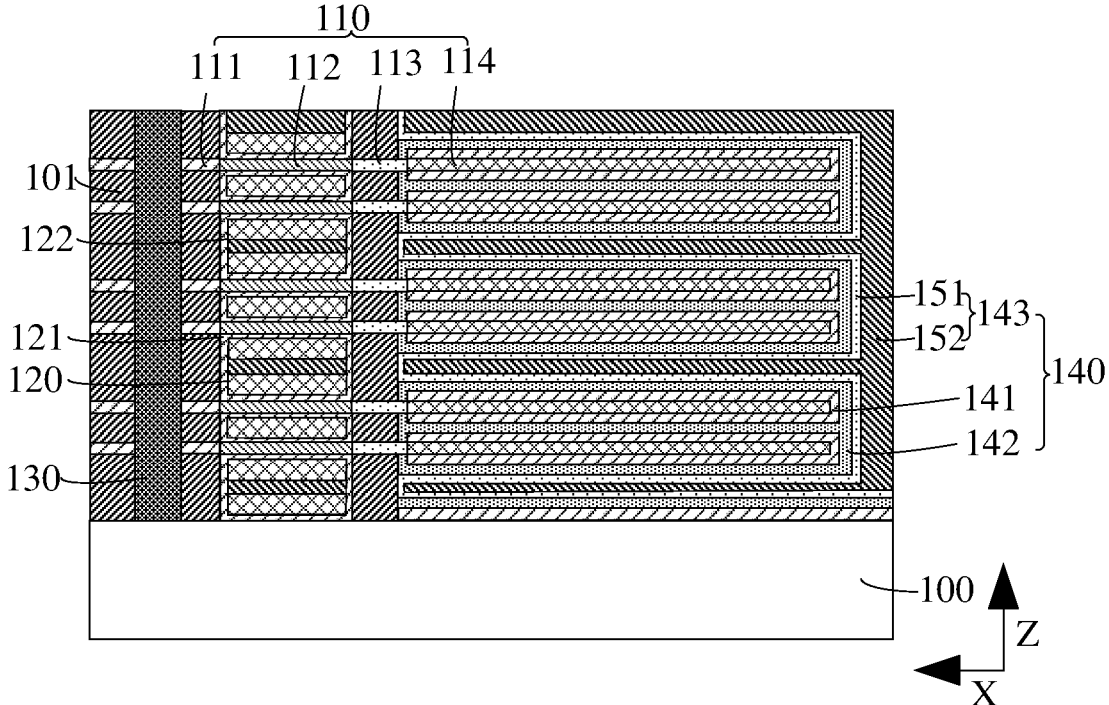
FIG. 2 is a schematic structural cross-sectional diagram of a semiconductor structure along a cross section A-A' according to an embodiment of the present disclosure.
Figures 3, 4:
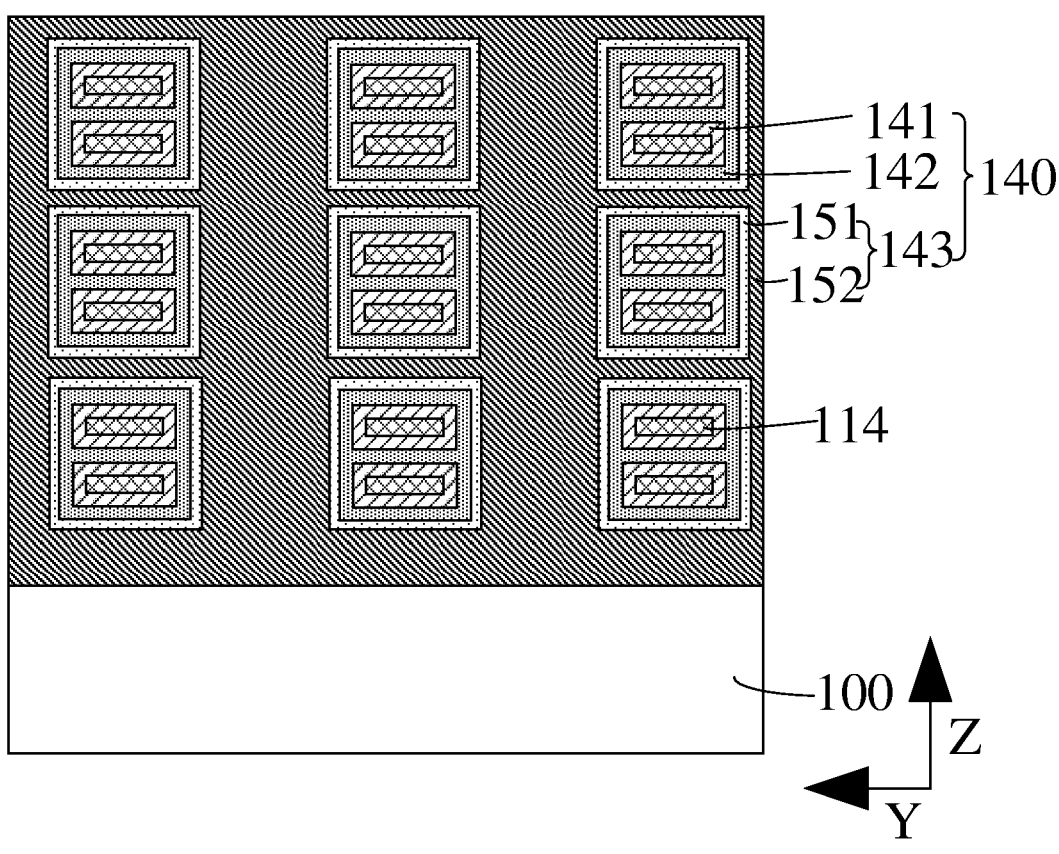
FIG. 3 is a schematic structural cross-sectional diagram of a semiconductor structure along a cross section B-B' according to an embodiment of the present disclosure.
FIG. 4 to FIG. 23 are schematic structural diagrams corresponding to various steps of a method of manufacturing a semiconductor structure according to an embodiment of the present disclosure.

FIG. 1 is a schematic structural diagram of a semiconductor structure according to an embodiment of the present disclosure. FIG. 2 is a schematic structural cross-sectional diagram of a semiconductor structure along a cross section A-A' according to an embodiment of the present disclosure. FIG. 3 is a schematic structural cross-sectional diagram of a semiconductor structure along a cross section B-B' according to an embodiment of the present disclosure.

With reference to FIG. 1 to FIG. 4, according to some embodiments of the present disclosure, according to an aspect, an embodiment of the present disclosure provides a semiconductor structure, including: a base 100, where a surface of the base 100 is provided with a bit line 130 extending along a first direction (a direction Z perpendicular to the surface of the base 100); active structures arranged at intervals along the direction perpendicular to the surface of the base 100, where the active structure includes at least two active layers 110 arranged at intervals, the active layer 110 includes a first source-drain region 111, a channel region 112, a second source-drain region 113, and a support region 114, and the bit line 130 is connected to the first source-drain region 111; word lines 120 extending along a second direction (a direction Y parallel to the surface of the base 100), where the word line 120 is connected to an adjacent active structure, and the word line 120 surrounds at least two channel regions 112 included in the connected active structure; and a memory structure 140 perpendicularly stacked on the base 100, where the memory structure 140 is connected to the second source-drain region 113, and the memory structure 140 surrounds the support region 114.

In some embodiments, the base 100 may be made of a semiconductor material. The semiconductor material may be any one of silicon, germanium, silicon germanium, or silicon carbide. The first source-drain region 111 is a source region of the semiconductor structure, and the second source-drain region 113 is a drain region of the semiconductor structure. In some other embodiments, the bit line 130 extends along the direction Y parallel to the surface of the base 100, and the word line 120 extends along the direction Z perpendicular to the surface of the base 100. The first source-drain region 111 is the drain region of the semiconductor structure, and the second source-drain region 113 is the source region of the semiconductor structure.

In some embodiments, there may be two or more active layers 110. For example, the semiconductor structure shown in FIG. 1 to FIG. 3 has two active layers 110. The active layers 110 are stacked to form the active structure with a plurality of channel regions, such that the active structure has high mobility and low conductive resistance. This can ensure that the semiconductor structure has a large driving current. In addition, a single active layer 110 of the active structure with the plurality of channel regions may be thin, such that electrons in a channel region of the active layer 110 can be completely depleted, which can suppress charge accumulation caused by a body effect, increase current density, and realize better power characteristics. The thin active layer 110 can also reduce a linewidth of the semiconductor structure in a direction perpendicular to the base. Specifically, in the direction perpendicular to the surface of the base 100, a thickness of the active layer 110 ranges from 3 nm to 10 nm, and may specifically be 3 nm, 5 nm, 7.6 nm, or 9.8 nm.

In some embodiments, the active structure includes at least two active layers 110 arranged at intervals along the direction Z perpendicular to the surface of the base 100, and in the direction Z perpendicular to the surface of the base 100, a spacing between adjacent active layers 110 included in the active structure is less than a spacing between adjacent active structures. An isolation layer 101 is formed between the adjacent active structures, and a thickness of the isolation layer 101 needs to ensure that adjacent word lines 120 are electrically insulated from each other. Moreover, an area of a subsequent second electrode plate 143 located between the adjacent active structures is large, which can increase a storage area of the semiconductor structure. Specifically, in the direction perpendicular to the surface of the base 100, the spacing between the adjacent active layers 110 ranges from 15 nm to 30 nm, and may specifically be 16 nm, 21 nm, 27.3 nm, or 29.8 nm. The spacing between the adjacent active structures ranges from 40 nm to 70 nm, and may specifically be 43 nm, 56 nm, 61 nm, or 69 nm. Similarly, the active structure includes at least two active layers 110 arranged at intervals along the direction Y parallel to the surface of the base 100, and in the direction Y parallel to the surface of the base 100, a spacing between the adjacent active layers 110 included in the active structure is less than a spacing between the adjacent active structures.

In some embodiments, the bit line 130 is a metal bit line, and a material of the bit line 130 may be tungsten, copper, molybdenum, silver, or another metal. Resistance of the metal itself is small, which is conducive to improving conductivity of the bit line 130 and the active layer 110. In some other embodiments, the bit line 130 may be a semiconductor bit line, and a material of the semiconductor bit line may be silicon, germanium, silicon germanium, silicon carbide or polysilicon. Moreover, the semiconductor bit line has a same type of doped element as the active layer 110. The doped element can be used as a carrier, which can improve migration and diffusion of carriers between the bit line 130 and the active layer 110, and is conducive to improving the conductivity of the bit line 130 and the active layer 110.

In some embodiments, the word line 120, the channel region 112 of the active layer 110, and the first source-drain region 111 and the second source-drain region 113 that are located at both ends of the channel region 112 constitute a transistor structure. There are at least two transistor structures in a direction pointing to the second source-drain region 113 along the first source-drain region 111. The two transistor structures are electrically connected to a same bit line 130, such that the two transistor structures share the bit line 130 and a direction X parallel to the base 100 is formed. In addition, the memory structures 140 at the other ends of the transistor structures can share a bit line 130. In this way, this embodiment of the present disclosure can realize three-dimensional stacking and reduce sizes of key devices by sharing the bit line 130, thereby improving performance of a semiconductor device and stability of the semiconductor structure.

In some embodiments, the word line 120 is used as a gate of the semiconductor structure, and the word line 120 surrounds the channel region 112 of the active layer 110, in other words, the semiconductor structure is a GAA structure. With the GAA structure, the gate can wrap all sides of the channel region of the active layer, which can avoid a leakage current, a capacitance effect, a short-channel effect, and other problems caused by reduction of a gate spacing, and reduce an area occupied by the word line 120 in a perpendicular direction. This is conducive to enhancing gate control performance and improving an integration degree of the semiconductor structure. The word line is also located between channel regions 112 of the adjacent active layers 110 in the active structure.

In some embodiments, a material of the word line 120 is any one of tungsten, tantalum, molybdenum, titanium nitride, or tantalum nitride, and a metal gate line is formed. In some other embodiments, the word line 120 is mainly made of doped polysilicon. An energy gap of the polysilicon is similar to that of a material of the active layer 110 as a channel, and a work function of the polysilicon can be changed by controlling a doping concentration, which is conducive to reducing a threshold voltage between the gate and the channel region 112 of the active layer 110. A type of a doped element of the doped polysilicon is the same as or different from that of a doped element of the channel region 112 of the active layer 110.

In some embodiments, the memory structure 140 may be a capacitor structure, and the support region 114 of the active layer 110 may be a support layer of the capacitor structure. In the semiconductor structure, a structure in which one transistor corresponds to one capacitor (1T-1C) can be formed. In a limited unit area of a device, increasing an area occupied by the memory structure to a greatest extent is conducive to increasing storage density. The memory structure 140 includes a first electrode plate 141, a dielectric layer 142, and a second electrode plate 143 that are successively stacked on a surface of the support region 114 of the active layer 110, and the dielectric layer 142 is also located between the adjacent active layers 110 in the active structure. The first electrode plate 141 is used as a lower electrode plate of the capacitor structure, and the second electrode plate 143 is used as an upper electrode plate of the capacitor structure. The second electrode plate 143 may be a common electrode of a plurality of capacitor structures. The memory structure 140 may be used as a storage element for storing data.

In some embodiments, the active structure is connected to at least two first electrode plates 141. The first electrode plate 141 covers a peripheral surface and an end face of the support region 114, the dielectric layer 142 covers a peripheral surface and an end face of the first electrode plate 141 and is connected to the at least two active layers 110 included in the active structure, and the second electrode plate 143 covers a peripheral surface and an end face of the dielectric layer 142. The first electrode plate 141 surrounds the support region 114 of the active layer 110, which increases a contact area between the memory structure 140 and the active layer 110, and contact resistance between the first electrode plate 141 and the active layer 110 is low.

In some embodiments, in the second direction, the second electrode plate 143 is also located between the adjacent active structures, and the second electrode plate 143 is located on a side surface of the isolation layer 101. The second electrode plate 143 includes a first sub-electrode plate 151 and a second sub-electrode plate 152, and the first sub-electrode plate 151 covers the side surface of the isolation layer 101 between the adjacent active structures. Both the second electrode plate 143 and the memory structure 140 have a relatively large area, which can increase the storage area of the semiconductor structure. A material of the first sub-electrode plate 151 is titanium, titanium nitride, ruthenium, cobalt, nickel, or tungsten, and a material of the second sub-electrode plate 152 is doped polysilicon or undoped polysilicon.

In some embodiments, a material of the first electrode plate 141 may be titanium, titanium nitride, ruthenium, cobalt, nickel, or tungsten. A material of the dielectric layer 142 may be any one or more of silicon oxide, silicon nitride, and a high dielectric constant material, and the high dielectric constant material may be hafnium oxide, zirconium oxide, aluminum oxide, lanthanum oxide, titanium oxide, tantalum oxide, niobium oxide, or strontium titanate.

In some embodiments, the semiconductor structure further includes: the isolation layer 101 located between the word line 120 and the memory structure 140, where the isolation layer 101 is also located between the bit line 130 and the word line 120, and the dielectric layer 142 is also located between the first electrode plate 141 and the isolation layer 101. The dielectric layer 142 is arranged between first electrode plates 141 electrically connected to different active layers 110, in other words, there is an open circuit between the first electrode plates 141 electrically connected to the different active layers 110, which can avoid failure of the memory structure 140 caused by an electrical connection between first electrode plates 141 corresponding to different transistors along a perpendicular direction of the base 100. The isolation layer 101 is used for insulation, and a material of the isolation layer 101 may be silicon nitride, silicon oxide, or another material with a high dielectric constant K. The material with the high dielectric constant K may be hafnium oxide, zirconium oxide, aluminum oxide, lanthanum oxide, titanium oxide, tantalum oxide, niobium oxide, or strontium titanate.

In some embodiments, the semiconductor structure further includes: a gate dielectric layer 121 located between the word line 120 and the active layer 110 and between the word line 120 and the isolation layer 101; and a first isolation layer 122 located between adjacent word lines 120 in the direction Z perpendicular to the surface of the base 100 and configured to isolate the adjacent word lines 120 to avoid a short circuit on an electrical connection between the adjacent word lines 120. A material of the first isolation layer 122 may be silicon oxide, silicon carbide, or silicon nitride. A material of the gate dielectric layer 121 may be silicon oxide, silicon carbide, silicon nitride, or another high dielectric constant material, which is used to suppress the short-channel effect, thereby suppressing a tunneling leakage current.

In the semiconductor structure provided in this embodiment of the present disclosure, the active structure in the semiconductor structure adopts two or more active layers 110, and the word line 120 surrounds the channel region 112 of the active layer 110, in other words, the semiconductor structure is a GAA structure. The active structure with the plurality of channel regions is used together with the GAA structure, and the stacked active layer 110 has high mobility and low conductive resistance, which can ensure that the semiconductor structure has a large driving current. Each of the stacked active layers 110 can be thin while ensuring a driving current. The thin active layer 110 can make the channel be completely depleted, so as to suppress a body effect. In addition, the thin active layer 110 is conducive to reducing a device linewidth in the perpendicular direction of the base 100. The memory structure 140 surrounds the support region 114 of the active layer 110, in other words, the active layer 110 can be used as a support layer between memory structures 140, which can reduce steps of forming the support layer and simplify the process. In addition, transistors and capacitors can be stacked on the surface of the base 100 in a three-dimensional manner to increase an area of the memory structure 140, which is conducive to increasing the storage density of the semiconductor structure.

Correspondingly, according to another aspect, an embodiment of the present disclosure provides a method of manufacturing a semiconductor structure. The manufacturing method can be used to manufacture the semiconductor structure shown in FIG. 1 to FIG. 3. FIG. 4 to FIG. 23 are schematic structural diagrams corresponding to various steps of a method of manufacturing a semiconductor structure according to an embodiment of the present disclosure. FIG. 4 to FIG. 13 are schematic structural diagrams corresponding to various steps in the method of manufacturing a semiconductor structure along a cross section A-A' according to this embodiment of the present disclosure. FIG. 14 to FIG. 23 are schematic structural diagrams corresponding to various steps in the method of manufacturing a semiconductor structure along a cross section B-B' according to this embodiment of the present disclosure. Contents same as or corresponding to those in the above embodiment will not be described in detail again below.

Figures 13, 14:
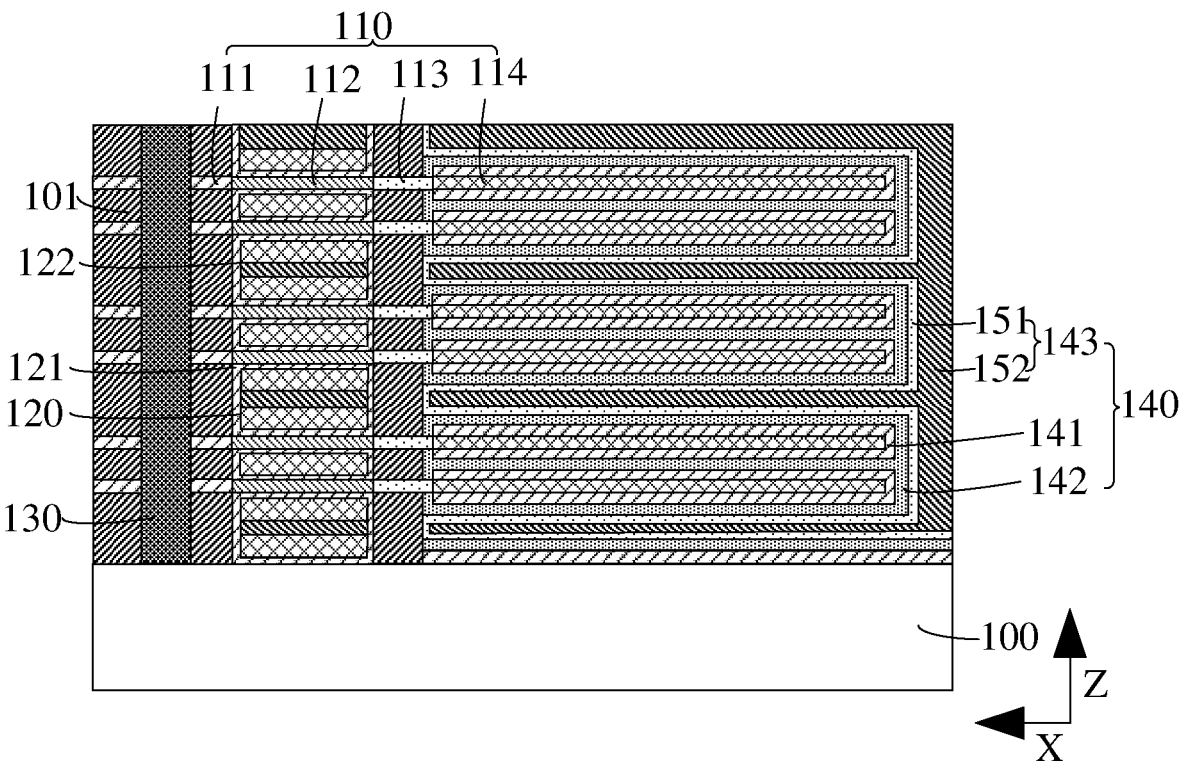

Referring to FIG. 4 and FIG. 14, a base 100 is provided, where a first sacrificial film 102, a first semiconductor film 103, a second sacrificial film 104, and a second semiconductor film 105 that are arranged at intervals are successively formed on a surface of the base 100.

In some embodiments, the base 100 is an initial base. The base 100 is made of a semiconductor material. The semiconductor material may be any one of silicon, germanium, silicon germanium, or silicon carbide. The first semiconductor film and the second semiconductor film are used to form an active layer. A material of the first semiconductor film 103 may be silicon, germanium, doped polysilicon, undoped polysilicon, or amorphous silicon. A doped element may be an N-type element or a P-type element. The N-type element may be a group-V element such as phosphorus (P), bismuth (Bi), antimony (Sb), or arsenic (As), and the P-type element may be a group-III element such as boron (B), aluminum (Al), gallium (Ga), or indium (In). A thickness of the first semiconductor film 103 ranges from 3 nm to 10 nm, and may specifically be 3 nm, 5 nm, 7.6 nm, or 9.8 nm. The thickness range of the first semiconductor film 103, in other words, a thickness range of the subsequently formed active layer, is used to realize a function of the active layer, make a channel be completely depleted, and suppress a body effect. Moreover, the first semiconductor film 103 and the second semiconductor film 105 can form the stacked active layer, so as to realize low conductive resistance and high mobility, such that the semiconductor structure has a large driving current. In addition, the first semiconductor film 103 is thin, which is conducive to reducing a device linewidth of the semiconductor structure in a perpendicular direction of the base 100. The material of the first semiconductor film 103 is the same as that the material of the second semiconductor film 105, and the thickness of the first semiconductor film 103 is the same as the thickness of the second semiconductor film 105. In some other embodiments, the material of the first semiconductor film is different from the material of the second semiconductor film. For example, the material of the first semiconductor film is silicon, and the material of the second semiconductor film is an amorphous material. The thickness of the first semiconductor film is different from the thickness of the second semiconductor film. For example, the thickness of the first semiconductor film is 6 nm, and the thickness of the second semiconductor film is 6.3 nm.

In some embodiments, in a region where the first sacrificial film 102 is located, a first isolation layer between adjacent word lines and memory structures corresponding to the two transistors are formed subsequently. A region where the second sacrificial film 104 is located is used as an internal structure of an active structure and an internal structure of the memory structure. Along a direction perpendicular to the surface of the base 100, a thickness of the second sacrificial film 104 is less than the thickness of the first sacrificial film 102. Therefore, the region where the first sacrificial film 102 is located is large, and a thickness of the first isolation layer between the adjacent word lines is large, which avoids failure of the word line due to an electrical connection between the adjacent word lines. The thickness of the first isolation layer is large, which can reduce parasitic capacitance between the adjacent word lines. In addition, a thickness of a second electrode plate subsequently formed in the region where the first sacrificial film 102 is located is large, which can increase a storage area of the semiconductor structure. A material of the first sacrificial film 102 is the same as a material of the second sacrificial film 104. Specifically, the material of the first sacrificial film 102 may be silicon germanium, an oxide, or polysilicon, and the oxide may be silicon oxide, aluminum oxide, or titanium oxide. A thickness of the first sacrificial film 102 ranges from 40 nm to 70 nm, and may specifically be 43 nm, 56 nm, 61 nm, or 69 nm. A thickness of the second sacrificial film 104 ranges from 15 nm to 30 nm, and may specifically be 16 nm, 21 nm, 27.3 nm, or 29.8 nm.

Figures 5, 6:
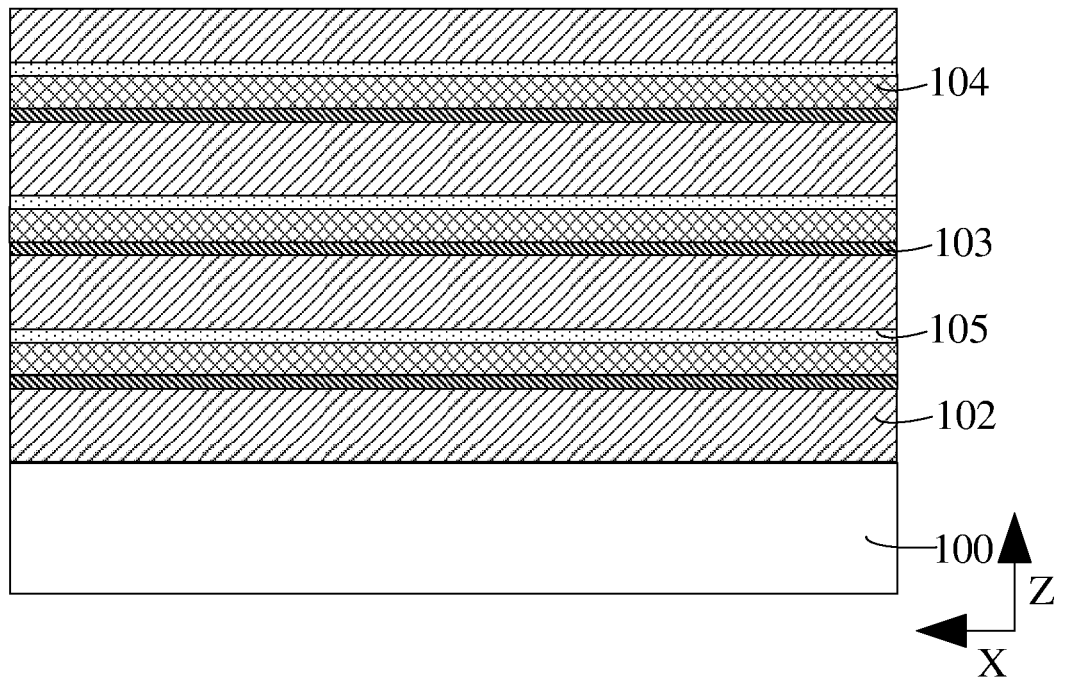
Figure 15:
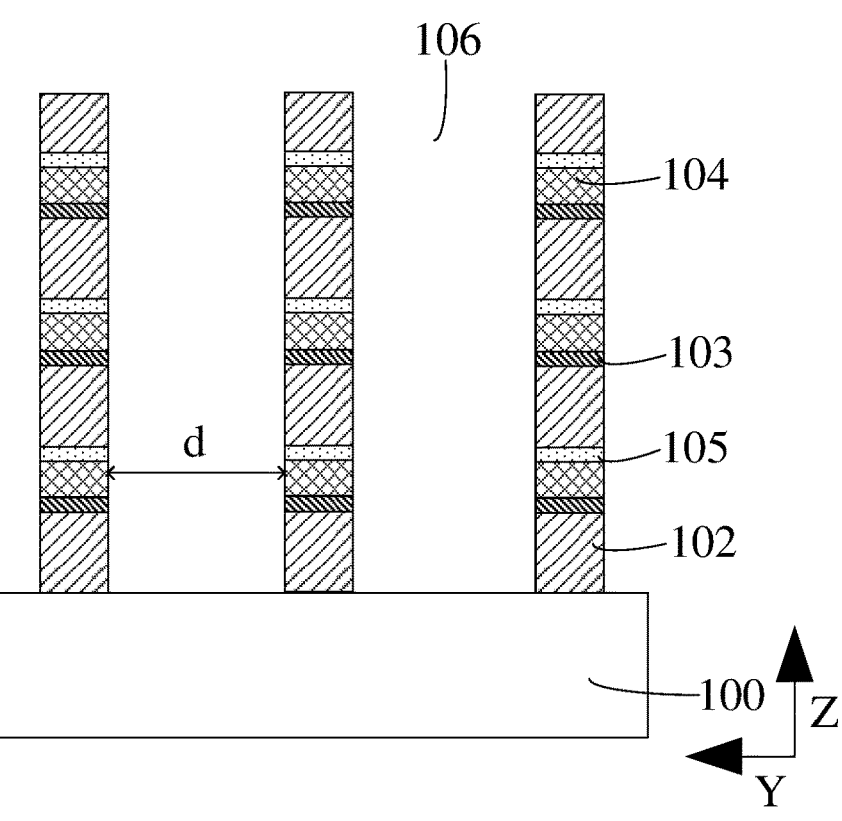

Referring to FIG. 5 and FIG. 15, the first sacrificial film 102, the first semiconductor film 103, the second sacrificial film 104, and the second semiconductor film 105 are patterned to form first grooves 106 arranged at intervals along a second direction, where a bottom of the first groove 106 exposes the base 100.

In some embodiments, the first groove 106 is etched to form active layers arranged at intervals along the second direction. The memory structure is arranged between adjacent active layers. In the second direction (a direction Y parallel to the surface of the base 100), a width d of the first groove 106 is greater than or equal to the thickness of the first sacrificial film 102. The memory structure subsequently formed in the first groove 106 may have a large area, in other words, the storage area of the semiconductor structure is increased, thereby increasing storage density of the semiconductor structure. Specifically, the width d of the first groove 106 ranges from 40 nm to 80 nm, and may specifically be 43 nm, 56 nm, 61 nm, or 78 nm.

Figure 16:
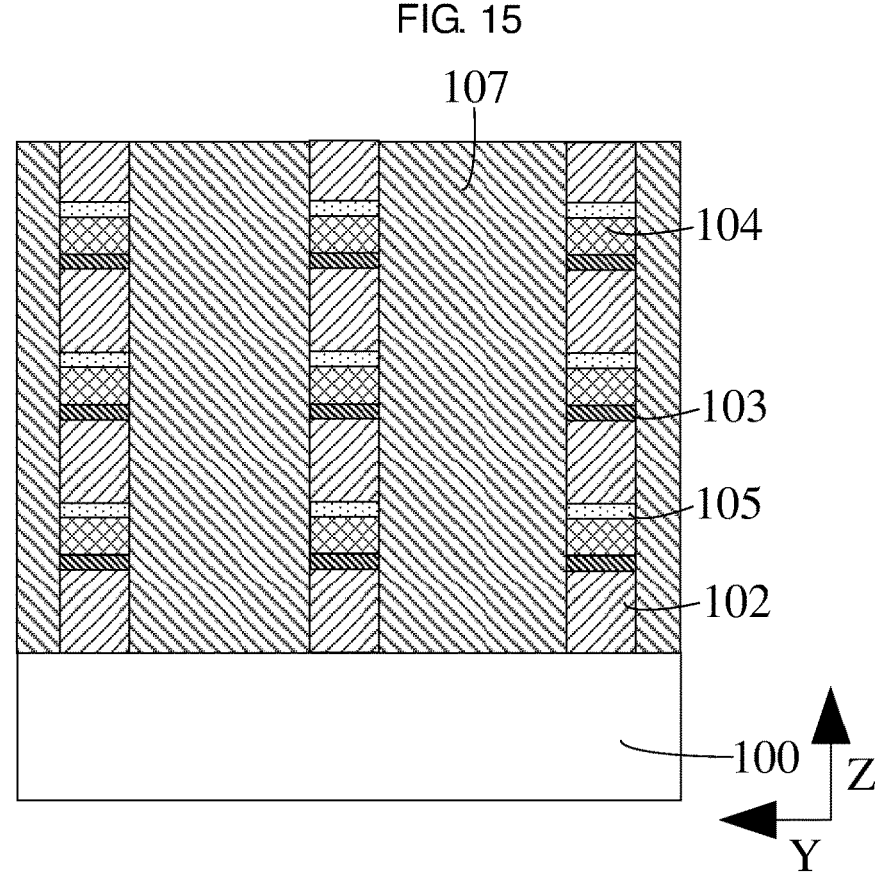

Referring to FIG. 6 and FIG. 16, a third sacrificial film 107 is formed, and the third sacrificial film 107 fills the first groove 106 (referring to FIG. 15).

Figures 7, 8:
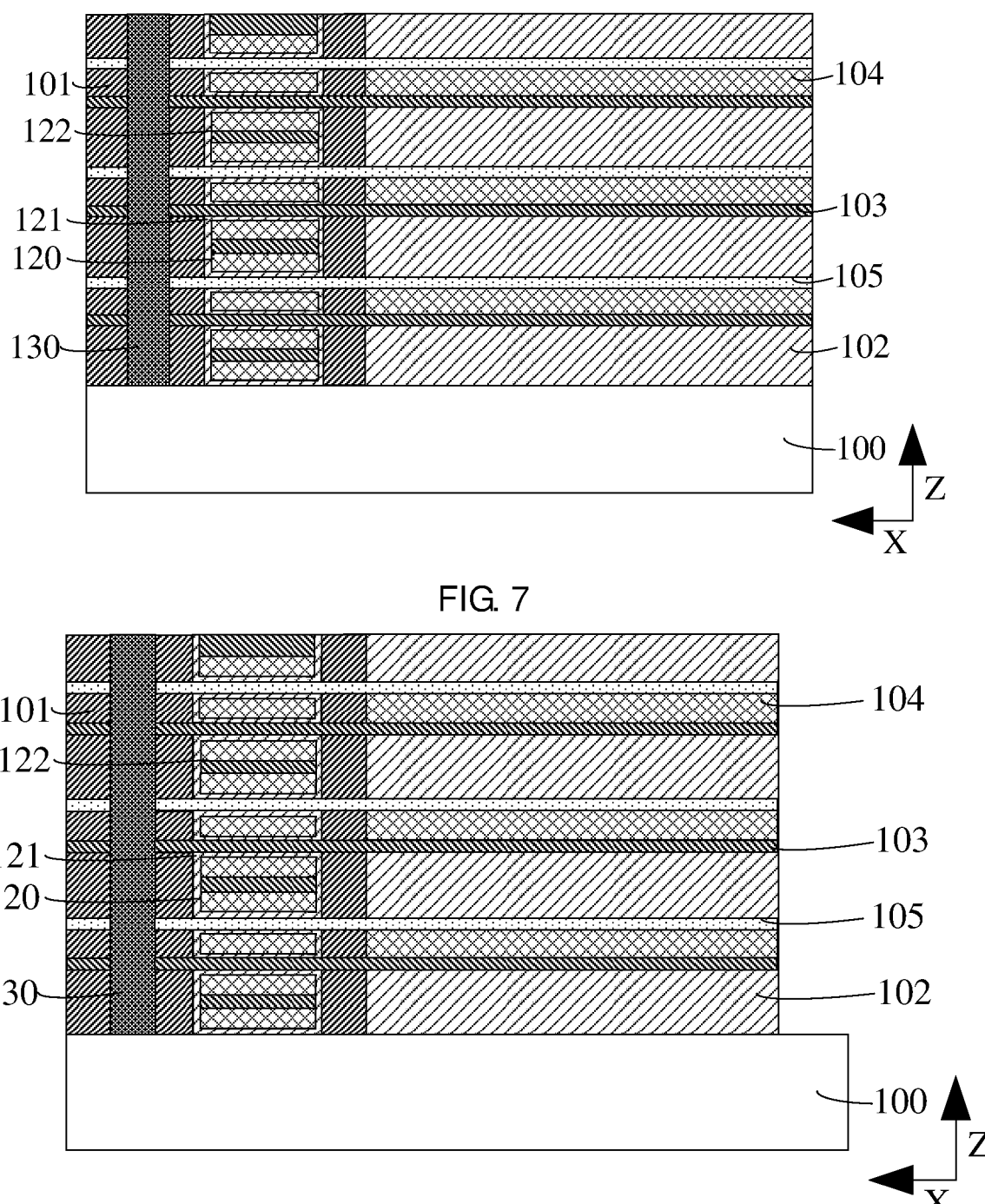
Figures 17, 18:
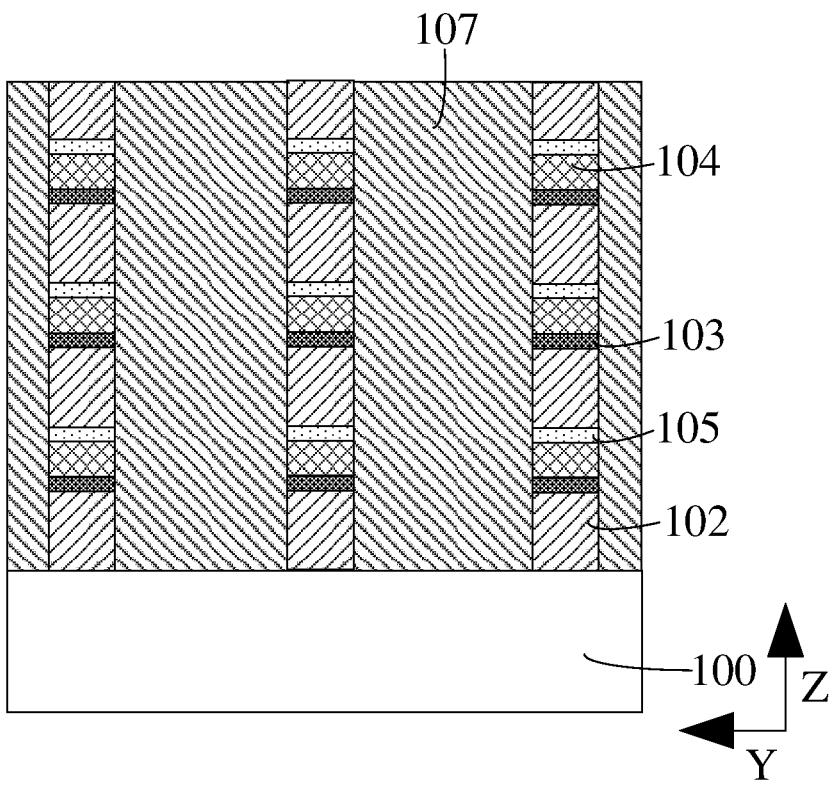

Referring to FIG. 7 and FIG. 17, a bit line 130 extending along the first direction (a direction Z perpendicular to the surface of the base 100) is formed. The bit line 130 is located on the surface of the base 100 and connected to a side surface of the first semiconductor film 103 and a side surface of the second semiconductor film 105. Word lines 120 extending along the second direction (the direction Y parallel to the surface of the base 100) are formed. The word line 120 is located between adjacent first semiconductor films 103, between adjacent first semiconductor film 103 and second semiconductor film 105, and the word line 120 partially surrounds the first semiconductor film 103 and the second semiconductor film 105.

In some embodiments, referring to FIG. 7, the method of manufacturing a semiconductor structure further includes: forming an isolation layer 101. The isolation layer 101 is located between the word line 120 and the first sacrificial film 102 and between the word line 120 and the second sacrificial film 104. The isolation layer 101 is used for insulation, and a material of the isolation layer 101 may be silicon nitride, silicon oxide, or another material with a high dielectric constant K. The material with the high dielectric constant K may be hafnium oxide, zirconium oxide, aluminum oxide, lanthanum oxide, titanium oxide, tantalum oxide, niobium oxide, or strontium titanate.

In some embodiments, referring to FIG. 7, the method of manufacturing a semiconductor structure further includes: forming a gate dielectric layer 121 located between the word line 120 and the first semiconductor film 103, between the word line 120 and the second semiconductor film 105, and between the word line 120 and the isolation layer 101; and forming the first isolation layer 122 located between adjacent word lines 120 in the direction Z perpendicular to the surface of the base 100 and configured to isolate the adjacent word lines 120 to avoid a short circuit on an electrical connection between the adjacent word lines 120. A material of the first isolation layer 122 may be silicon oxide, silicon carbide, or silicon nitride. A material of the gate dielectric layer 121 may be silicon oxide, silicon carbide, silicon nitride, or another high dielectric constant material, which is used to suppress a short-channel effect, thereby suppressing a tunneling leakage current.

Referring to FIG. 8 to FIG. 13 and FIG. 18 to FIG. 23, the memory structure 140 is formed. The memory structure 140 is perpendicularly stacked on the base 100 and connected to a second source-drain region 113 of the active layer 110. The memory structure 140 surrounds a support region 114 of the active layer 110, and includes a first electrode plate 141, a dielectric layer 142, and a second electrode plate 143 that are successively stacked on a surface of the support region 114. The dielectric layer 142 is also located between the adjacent active layers 110 in the active structure.

In some embodiments, the memory structure 140 may be a capacitor structure, and the support region 114 of the active layer 110 may be a support layer of the capacitor structure. In the semiconductor structure, a structure in which one transistor corresponds to one capacitor (1T-1C) can be formed. In a limited unit area of a device, increasing an area occupied by the memory structure 140 to a greatest extent is conducive to increasing storage density. The first electrode plate 141 is used as a lower electrode plate of the capacitor structure, and the second electrode plate 143 is used as an upper electrode plate of the capacitor structure. The second electrode plate 143 may be a common electrode of a plurality of capacitor structures. The memory structure 140 may be used as a storage element for storing data.

In some embodiments, the active structure is connected to at least two first electrode plates 141. The first electrode plate 141 covers a peripheral surface and an end face of the support region 114, the dielectric layer 142 covers a peripheral surface and an end face of the first electrode plate 141 and is connected to the at least two active layers 110 included in the active structure, and the second electrode plate 143 covers a peripheral surface and an end face of the dielectric layer 142. The first electrode plate 141 surrounds the support region 114 of the active layer 110, which increases a contact area between the memory structure 140 and the active layer 110, and contact resistance between the first electrode plate 141 and the active layer 110 is low.

In some embodiments, in the second direction, the second electrode plate 143 is also located between the adjacent active structures, and the second electrode plate 143 is located on a side surface of the isolation layer 101. The second electrode plate 143 includes a first sub-electrode plate 151 and a second sub-electrode plate 152, and the first sub-electrode plate 151 is located on the side surface of the isolation layer 101. Both the second electrode plate 143 and the memory structure 140 have a relatively large area, which can increase the storage area of the semiconductor structure.

Specifically, referring to FIG. 8 and FIG. 18, the first sacrificial film 102, the second sacrificial film 104, the first semiconductor film 103, and the second semiconductor film 105 are removed by a certain width along a direction X parallel to the surface of the base.

Figure 9:
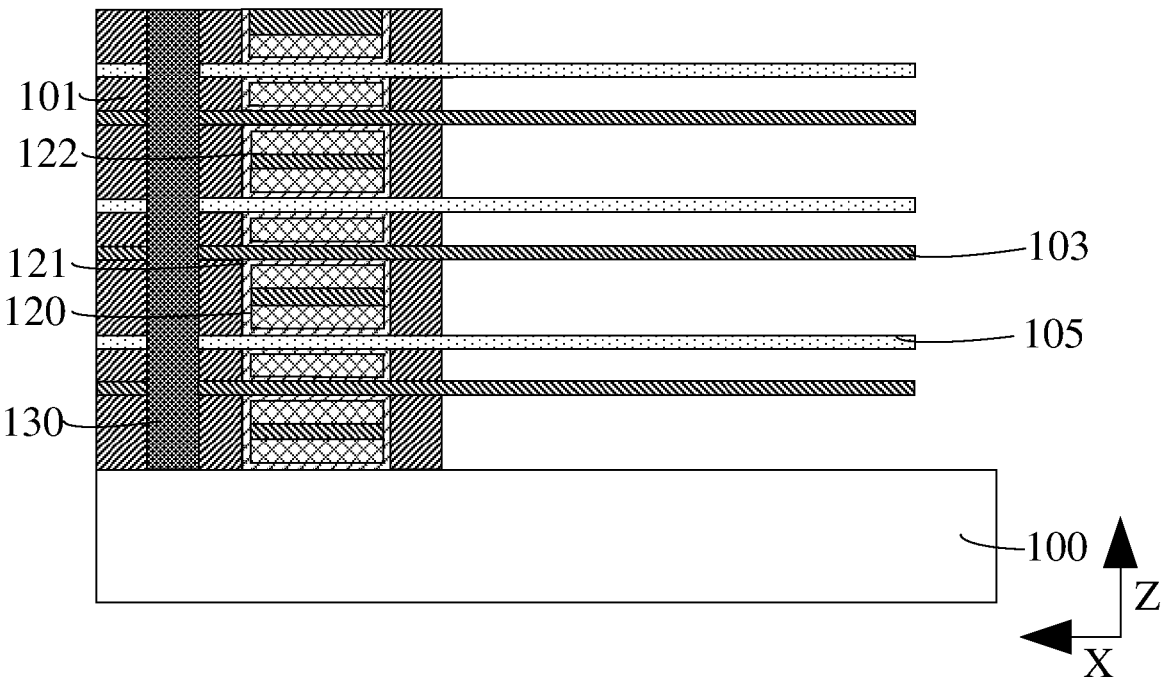
Figures 19, 20:
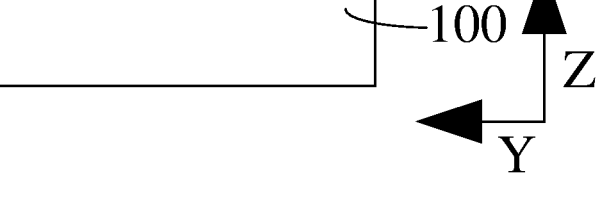

Referring to FIG. 9 and FIG. 19, the first sacrificial film 102 and the second sacrificial film 104 are partially etched to expose surfaces of the first semiconductor film 103 and the second semiconductor film 105.

In some other embodiments, the first semiconductor film and the second semiconductor film can be removed by a certain width along the direction parallel to the surface of the base, while the first sacrificial film and the second sacrificial film are etched; or the first sacrificial film and the second sacrificial film are removed through etching, and then the first semiconductor film and the second semiconductor film are removed by a certain width along the direction parallel to the surface of the base.

Figure 10:
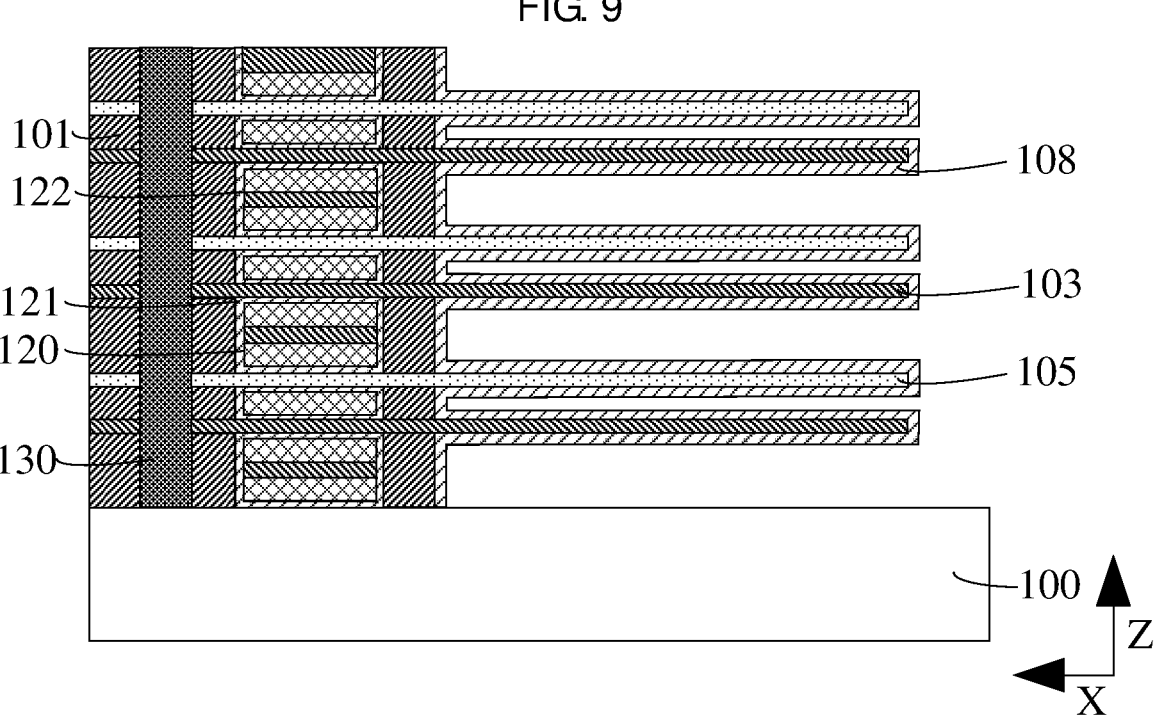

Referring to FIG. 10 and FIG. 20, a conductive layer 108 is formed on the surfaces of the first semiconductor film 103 and the second semiconductor film 105 and a surface of the isolation layer 101. A material of the conductive layer 108 may be titanium, titanium nitride, ruthenium, cobalt, nickel, or tungsten.

Figure 11:
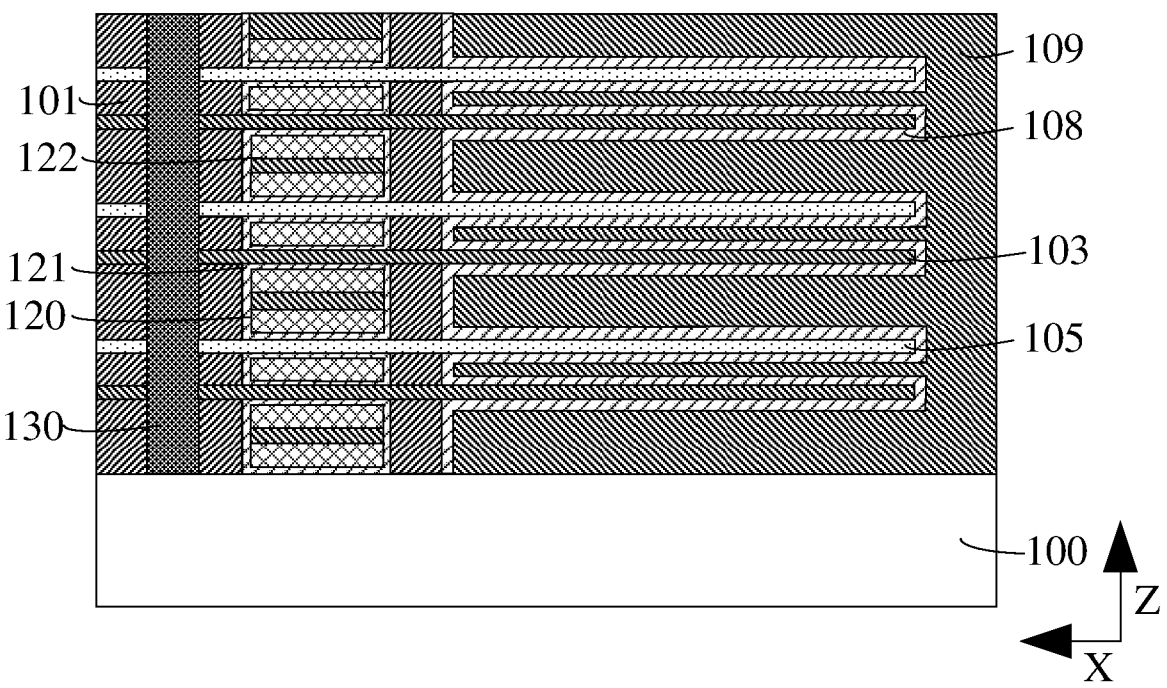
Figures 21, 22:
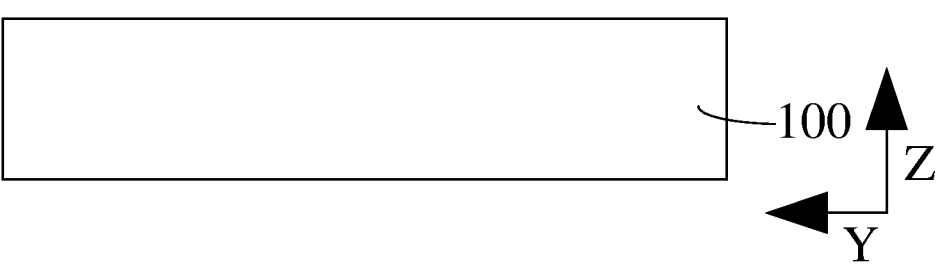

Referring to FIG. 11 and FIG. 21, a protective layer 109 is formed, where the protective layer 109 fills the first groove 106 (referring to FIG. 15) and is located between the adjacent first semiconductor films 103. The protective layer 109 is configured to ensure that only the conductive layer 108 located on the surface of the isolation layer 101 is etched, so as to avoid etching more parts of the conductive layer 108 or causing a damage to the remaining conductive layer 108. A material of the protective layer 109 may be an oxide or a nitride. The oxide may be silicon oxide or aluminum oxide, and the nitride may be silicon nitride.

In some embodiments, a top surface of the conductive layer 108 is flush with a top surface of the protective layer 109 in the direction perpendicular to the surface of the base 100, such that the conductive layer 108 located on the surface of the isolation layer 101 can be etched through a top surface of the exposed conductive layer 108.

Figure 12:
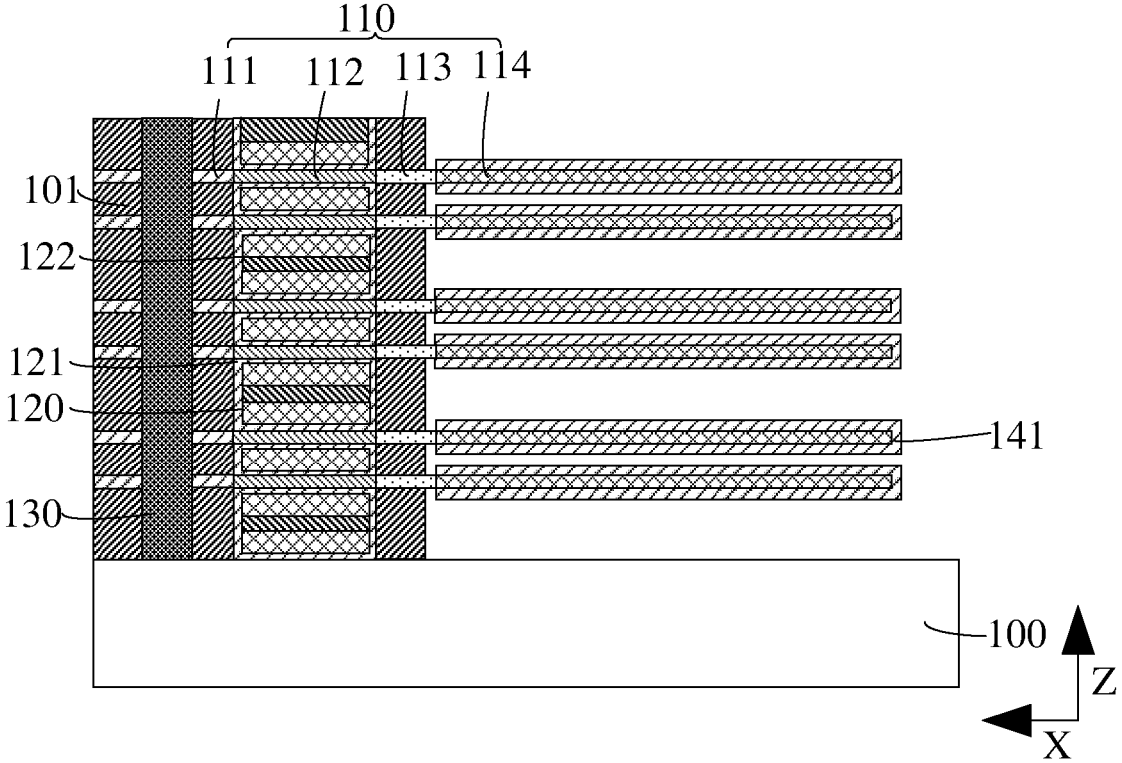

Referring to FIG. 12 and FIG. 22, the conductive layer 108 on the surface of the isolation layer 101 (referring to FIG. 11) and the protective layer 109 (referring to FIG. 11) are removed through etching, and the remaining conductive layer 108 (referring to FIG. 11) is used as the first electrode plate 141.

Figure 23:
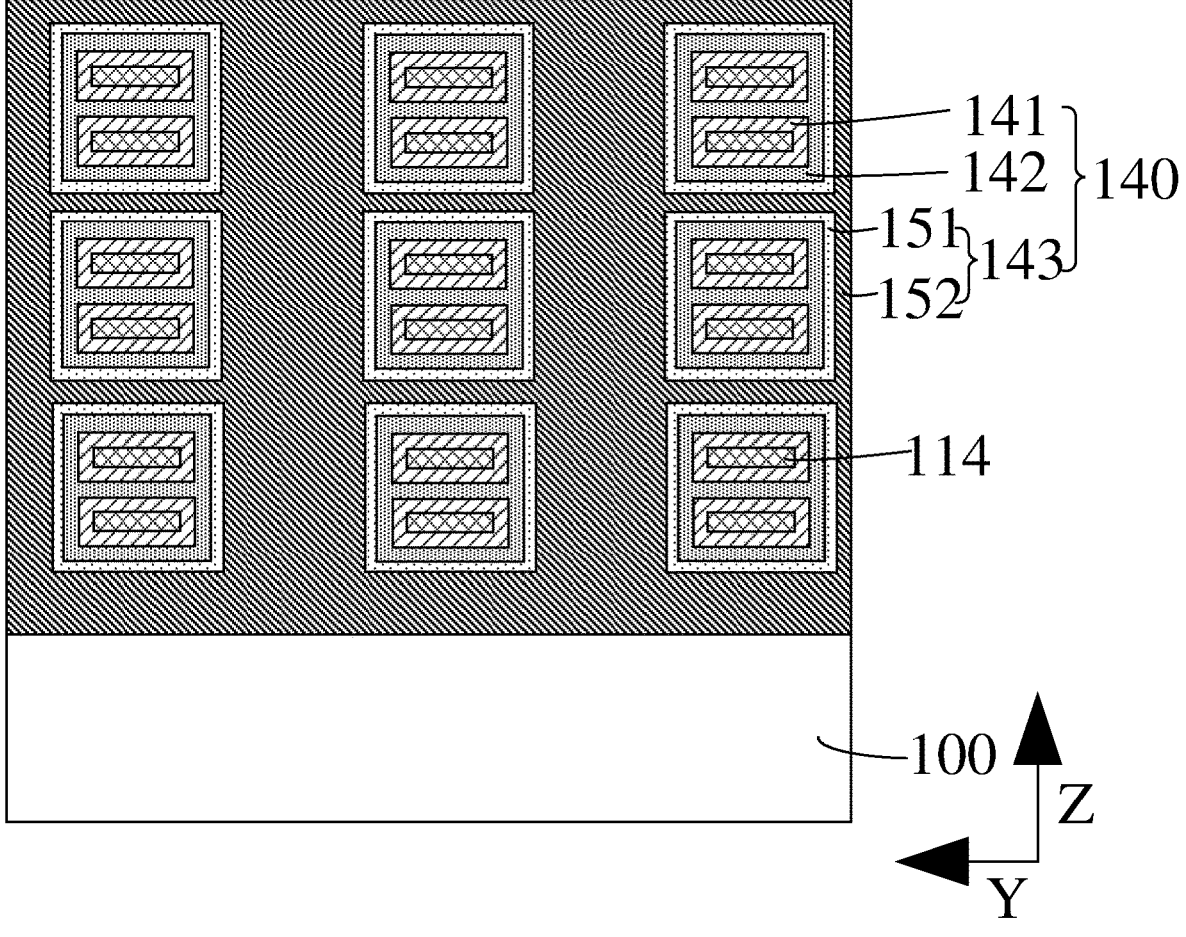

Referring to FIG. 13 and FIG. 23, the dielectric layer 142, the first sub-electrode plate 151, and the second sub-electrode plate 152 are formed on a surface of the first electrode plate 141, and the first sub-electrode plate 151 and the second sub-electrode plate 152 are jointly used as the second electrode plate 143.

In some embodiments, a material of the first sub-electrode plate 151 is titanium, titanium nitride, ruthenium, cobalt, nickel, or tungsten, and a material of the second sub-electrode plate 152 is doped polysilicon or doped polysilicon. A material of the dielectric layer 142 is silicon nitride, silicon oxide, or another material with a high dielectric constant K. The material with the high dielectric constant K may be hafnium oxide, zirconium oxide, aluminum oxide, lanthanum oxide, titanium oxide, tantalum oxide, niobium oxide, or strontium titanate.

In some embodiments, the remaining first semiconductor film 103 (referring to FIG. and second semiconductor film 105 (referring to FIG. 10) are used as the active layer 110, and the first semiconductor film 103 (referring to FIG. 10) and the second semiconductor film 105 (referring to FIG. 10) that are surrounded by the word line 120 are used as a channel region 112 of the active layer 110. The first semiconductor film 103 (referring to FIG. 10) and the second semiconductor film 105 (referring to FIG. 10) that are electrically connected to the bit line 130 are used as a first source-drain region 111 of the active layer 110, and the first semiconductor film 103 (referring to FIG. 10) and the second semiconductor film 105 (referring to FIG. 10) that are electrically connected to the first electrode plate 141 are used as the second source-drain region 113 of the active layer 110. The first semiconductor film 103 (referring to FIG. 10) and the second semiconductor film 105 (referring to FIG. 10) that are surrounded by the memory structure 140 are used as the support region 114 of the active layer 110. The active layer 110 formed by the first semiconductor film 103 (referring to FIG. 10) and the active layer 110 formed by the second semiconductor film 105 (referring to FIG. 10) are jointly used as the active structure.

Those of ordinary skill in the art can understand that the above implementations are specific embodiments for implementing the present disclosure. In practical applications, various changes may be made to the above embodiments in terms of forms and details without departing from the spirit and scope of the present disclosure. Any person skilled in the art may make changes and modifications to the embodiments without departing from the spirit and scope of the present disclosure. Therefore, the protection scope of the present disclosure should be subject to the scope defined by the claims.

The invention claimed is:

1. A semiconductor structure, comprising:
a base, wherein a bit line that extends along a first direction is provided on a surface of the base;
active structures arranged at intervals along the first direction, wherein the active structure comprises at least two active layers arranged at intervals, the active layer comprises a first source-drain region, a channel region, a second source-drain region, and a support region, and the bit line is connected to the first source-drain region;
a word line extending along a second direction, wherein the word line is connected to an adjacent active structure, and the word line surrounds at least two channel regions comprised in the connected active structure; and
a memory structure perpendicularly stacked on the base, wherein the memory structure is connected to the second source-drain region, and the memory structure surrounds the support region;
wherein the first direction is perpendicular to the surface of the base, the second direction is parallel to the surface of the base.

2. The semiconductor structure according to claim 1, wherein the memory structure comprises a first electrode plate, a dielectric layer, and a second electrode plate that are successively stacked on a surface of the support region, and the dielectric layer is also located between adjacent active layers in the active structure.

3. The semiconductor structure according to claim 2, wherein the active structure is connected to at least two first electrode plates; and the first electrode plate covers a peripheral surface and an end face of the support region, the dielectric layer covers a peripheral surface and an end face of the first electrode plate and is connected to the at least two active layers comprised in the active structure, and the second electrode plate covers a peripheral surface and an end face of the dielectric layer.

4. The semiconductor structure according to claim 2, wherein the second electrode plate is also located between adjacent active structures.

5. The semiconductor structure according to claim 2, further comprising: an isolation layer located between the word line and the memory structure, wherein the isolation layer is also located between the bit line and the word line, and the dielectric layer is also located between the first electrode plate and the isolation layer.

6. The semiconductor structure according to claim 5, wherein the second electrode plate is located on a side surface of the isolation layer; and the second electrode plate comprises a first sub-electrode plate and a second sub-electrode plate, and the first sub-electrode plate covers the side surface of the isolation layer between adjacent active structures.

7. The semiconductor structure according to claim 1, wherein the active structure comprises at least two active layers arranged at intervals along the first direction, and in the first direction, a spacing between adjacent active layers comprised in the active structure is less than a spacing between adjacent active structures.

8. The semiconductor structure according to claim 1, wherein the active structure comprises at least two active layers arranged at intervals along the second direction, and in the second direction, a spacing between adjacent active layers comprised in the active structure is less than a spacing between adjacent active structures.

9. The semiconductor structure according to claim 1, wherein the word line is also located between channel regions of adjacent active layers in the active structure.

10. The semiconductor structure according to claim 1, wherein the first source-drain penetrates through the bit line connected thereto.

11. A method of manufacturing a semiconductor structure, comprising:
providing a base;
forming active structures and a bit line that extends along a first direction, wherein the bit line is located on a surface of the base, the active structures are arranged at intervals along the first direction, the active structure comprises at least two active layers arranged at intervals, the active layer comprises a first source-drain region, a channel region, a second source-drain region, and a support region, and the bit line is connected to the first source-drain region;
forming a word line extending along a second direction, wherein the word line is connected to an adjacent active structure, and the word line surrounds at least two channel regions comprised in the connected active structure; and
forming a memory structure perpendicularly stacked on the base, wherein the memory structure is connected to the second source-drain region, and the memory structure surrounds the support region;

wherein the first direction is perpendicular to the surface of the base, the second direction is parallel to the surface of the base.

12. The method of manufacturing the semiconductor structure according to claim 11, wherein the forming a memory structure comprises:

providing an initial base, and successively forming a first sacrificial film, a first semiconductor film, a second sacrificial film, and a second semiconductor film that are arranged at intervals on a surface of the initial base;

patterning the first sacrificial film, the first semiconductor film, the second sacrificial film, and the second semiconductor film to form first grooves arranged at intervals along the second direction, wherein a bottom of the first groove exposes the initial base;

partially etching the first sacrificial film and the second sacrificial film to expose surfaces of the first semiconductor film and the second semiconductor film; and forming a first electrode plate, a dielectric layer, and a second electrode plate successively on the surfaces of the first semiconductor film and the second semiconductor film, wherein the first electrode plate, the dielectric layer, and the second electrode plate jointly form the memory structure, and the first semiconductor film and the second semiconductor film are used as the active layer.

13. The method of manufacturing the semiconductor structure according to claim 12, wherein in the first direction, a thickness of the second sacrificial film is less than a thickness of the first sacrificial film, and a material of the first sacrificial film is the same as a material of the second sacrificial film.

14. The method of manufacturing the semiconductor structure according to claim 12, before the partially etching the first sacrificial film and the second sacrificial film, further comprising: forming an isolation layer, the word line, and the bit line, wherein the isolation layer is located between the word line and the first sacrificial film and between the word line and the second sacrificial film.

15. The method of manufacturing the semiconductor structure according to claim 14, wherein the first semiconductor film and the second semiconductor film are removed by a certain width along a direction parallel to the surface of the base, while the first sacrificial film and the second sacrificial film are etched partially.

16. The method of manufacturing the semiconductor structure according to claim 14, wherein forming the first electrode plate on the surfaces of the first semiconductor film and the second semiconductor film comprises:

forming a conductive layer on the surfaces of the first semiconductor film and the second semiconductor film and a surface of the isolation layer;

forming a protective layer, wherein the protective layer fills the first groove and is located between adjacent first semiconductor films; and removing the conductive layer on the surface of the isolation layer and the protective layer through etching, and using the remaining conductive layer as the first electrode plate.

17. The method of manufacturing the semiconductor structure according to claim 12, wherein in the second direction, a width of the first groove is greater than or equal to a thickness of the first sacrificial film.

18. The method of manufacturing the semiconductor structure according to claim 12, wherein a material of the first semiconductor film is the same as a material of the second semiconductor film, and a thickness of the first semiconductor film is the same as a thickness of the second semiconductor film.

* * * * *